United States Patent
Gregory (10) Patent No.: US 12,009,230 B2
(45) Date of Patent: Jun. 11, 2024

(54) BONDING DEVICE AS WELL AS METHOD FOR BONDING SUBSTRATES

(71) Applicant: SUSS MicroTec Lithography GmbH, Garching (DE)

(72) Inventor: George Gregory, Garching (DE)

(73) Assignee: SUSS MICROTEC LITHOGRAPHY GMBH (DE)

( * ) Notice: Subject to any disclaimer, the term of this patent is extended or adjusted under 35 U.S.C. 154(b) by 437 days.

(21) Appl. No.: 17/611,086

(22) PCT Filed: May 13, 2019

(86) PCT No.: PCT/EP2019/062234
§ 371 (c)(1),
(2) Date: Nov. 12, 2021

(87) PCT Pub. No.: WO2020/228940
PCT Pub. Date: Nov. 19, 2020

(65) Prior Publication Data
US 2022/0230895 A1 Jul. 21, 2022

(51) Int. Cl.
*H01L 21/67* (2006.01)
*H01L 21/683* (2006.01)

(52) U.S. Cl.
CPC .. *H01L 21/67092* (2013.01); *H01L 21/67017* (2013.01); *H01L 21/67248* (2013.01);
(Continued)

(58) Field of Classification Search
CPC ......... H01L 21/67092; H01L 21/67017; H01L 21/67248; H01L 21/67103; H01L 21/6831;
(Continued)

(56) References Cited

U.S. PATENT DOCUMENTS

| 5,708,556 A | * | 1/1998 | van Os | H01L 21/6831 |
| | | | | 361/234 |
| 7,682,933 B1 | | 3/2010 | Loomis | 438/457 |

(Continued)

FOREIGN PATENT DOCUMENTS

| EP | 3208828 | 8/2017 | ............. H01L 21/02 |
| JP | 2010-267708 | 11/2010 | ........... H01L 21/683 |

(Continued)

OTHER PUBLICATIONS

PCT International Search Report and Written Opinion issued in PCT International Patent Application Serial No. PCT/EP2019/062234, dated Feb. 3, 2020, 19 pages.

(Continued)

*Primary Examiner* — Michael A Tolin
*Assistant Examiner* — Christopher C Caillouet
(74) *Attorney, Agent, or Firm* — HAYES SOLOWAY P.C.

(57) ABSTRACT

A bonding device has two chucks, two gas pressure regulators and a control unit. The chucks each have a holding surface with pressure ports fluidically connected to the respective gas pressure regulator. The control unit is electrically and/or wirelessly connected to the gas pressure regulators and configured to control gas pressure regulators independently from each other. Support elements movably mounted within the pressure ports, are provided to measure the amount of substrate deflection and adjust the respective gas pressures and also to apply additional mechanical pressure to the substrates. The two chucks may be mounted on corresponding support structures so as to be thermally isolated therefrom. The temperature of the two chucks may be equalised by moving the chucks into contact. A chuck tempering device may be used for equalising the temperature of the two chucks. The bonding device is used for bonding two substrates by bonding wave propagation.

29 Claims, 5 Drawing Sheets

(52) U.S. Cl.
CPC .... *H01L 21/67103* (2013.01); *H01L 21/6831* (2013.01); *H01L 21/6838* (2013.01)

(58) Field of Classification Search
CPC . H01L 21/6838; H01L 21/185; H01L 21/187; H01L 2224/80894; H01L 21/67098; H01L 21/683; B32B 37/003
See application file for complete search history.

(56) References Cited

U.S. PATENT DOCUMENTS

| | | | |
|---|---|---|---|
| 10,985,132 B2 | 4/2021 | Otsuka et al. | B32B 41/00 |
| 10,991,609 B2 | 4/2021 | Zinner et al. | H01L 21/68 |
| 11,059,280 B2 | 7/2021 | Wagenleitner et al. | B32B 38/18 |
| 11,282,706 B2 | 3/2022 | Wagenleitner et al. | H01L 21/20 |
| 2012/0193009 A1 | 8/2012 | Fujii | 156/60 |
| 2014/0208556 A1 | 7/2014 | Sugihara et al. | H01L 21/687 |
| 2014/0349465 A1 | 11/2014 | Yamamoto et al. | H01L 21/18 |
| 2015/0129137 A1 | 5/2015 | Sugihara et al. | B32B 38/18 |
| 2015/0357226 A1 | 12/2015 | Liu et al. | H01L 21/683 |
| 2018/0047699 A1 | 2/2018 | Omori et al. | H01L 24/743 |
| 2018/0323089 A1* | 11/2018 | Wada | H01L 21/6838 |
| 2019/0019678 A1 | 1/2019 | Wagenleitner et al. | H01L 21/20 |
| 2019/0027462 A1 | 1/2019 | Sugaya et al. | H01L 23/00 |

FOREIGN PATENT DOCUMENTS

| | | | |
|---|---|---|---|
| JP | 2018-93018 | 6/2018 | H01L 31/02 |
| WO | WO2012114826 | 8/2012 | H01L 21/02 |
| WO | WO2014191033 | 12/2014 | H01L 21/18 |
| WO | WO2017155002 | 9/2017 | H01L 21/02 |
| WO | WO2017162272 | 9/2017 | H01L 21/67 |
| WO | WO2018028801 | 2/2018 | H01L 21/18 |
| WO | WO2018062467 | 4/2018 | H01L 21/02 |

OTHER PUBLICATIONS

PCT International Preliminary Report on Patentability issued in PCT International Patent Application Serial No. PCT/EP2019/062234, dated Nov. 16, 2021, 13 pages.

* cited by examiner

BONDING DEVICE AS WELL AS METHOD FOR BONDING SUBSTRATES

The invention relates to a bonding device for bonding substrates as well as a method for bonding substrates.

In the fabrication of electronic devices, bonding substrates, especially wafers with structures, is a common technique to reduce the overall size of a device.

For bonding, the so-called direct or fusion bonding technique is known, in which the substrates are pressed firmly against each other so that they bond to each other.

To avoid voids and distortions, bond front propagation methods are known, in which one of the wafers is deflected at its center towards the other wafer. After the initial bond, the bond front or bonding wave moves outwards having an incident angle between the two substrates.

However, errors due to scale distortion of the two wafers still occur.

It is thus the object of the invention to provide a bonding device and a method for bonding substrates that reduces scale distortions and increases quality of the bond.

For this purpose, a bonding device for bonding substrates is provided. The bonding device comprising a first chuck, a second chuck, a first gas pressure regulator, a second gas pressure regulator and a control unit. The first chuck comprises a first holding surface for holding a first substrate, the first holding surface having a first pressure port fluidically connected to the first gas pressure regulator. The second chuck comprises a second holding surface for holding a second substrate, the second holding surface having a second pressure port fluidically connected to the second gas pressure regulator. The control unit is electrically and/or wirelessly connected to the first gas pressure regulator and the second gas pressure regulator, the control unit being configured to control the first gas pressure regulator and the second gas pressure regulator independently from each other.

By controlling the gas pressure leading to the deflection of the first substrate independently from the second gas pressure causing the deflection of the second substrate, it is possible to account for various situations that would have otherwise led to scale distortions.

The gas pressures may be in the range of 12 to 25 mbar. For example, the pressure applied to the first and second pressure ports differ from one another.

The bonding device may be a device for fusion bonding and/or direct bonding.

The first substrate and/or the second substrate may be a wafer, for example a semiconductor wafer, in particular a silicon wafer. One or both of the substrates may have structures.

The chucks and/or substrates are parallel and/or concentric to one another. In particular, the chucks are movable towards each other.

For example, the control unit has access to at least one property of the first substrate and/or at least one property of the second substrate, in particular a mechanical property, like the nominal size and/or diameter of the substrate, the actual size and/or diameter of the substrate, the stiffness of the substrate, and/or an environmental property, like the temperature of the substrate. The control unit is configured to control the first gas pressure regulator and/or the second gas pressure regulator depending on the at least one property of the first substrate, on the at least one property of the second substrate or on the at least one property of the first substrate and the second substrate. This way, the deflection caused by the gas pressures may be controlled even more accurately.

The control unit may have access to at least one property of the first substrate and/or to the at least one property of the second substrate using a database, in which the respective property is stored or a user interface for receiving the respective property. The respective property is measured and stored in the database and/or supplied to the user interface.

In an embodiment, the first pressure port and/or the second pressure port are arranged at the center, in particular at the center of the area of the respective holding surface or chuck, and/or that the first pressure port and the second pressure port are in alignment, creating a rotational-symmetric deflection of each substrate and/or the best overlap of the substrates.

For a stable and secure process, the chucks, in particular the holding surface comprise holding means, in particular vacuum means, electrostatic means or mechanical clamping means, for fixation of a substrate.

To allow sufficient deflection, the holding means, in particular at least one vacuum groove, are provided at the edge portion of the respective holding surface.

The edge portion is in particular the area of the substrate and chuck, respectively, that corresponds to the radially outer 5% to 20% of the radius.

The vacuums means may be connected to a vacuum source.

For supplying sufficient gas pressure, the bonding device comprises at least one gas pressure source, in particular wherein the at least one gas pressure source is fluidically connected to the first gas pressure regulator and the second gas pressure regulator.

For example, the gas pressure source, e.g. a compressor, is itself a pressure regulator. In this case, a first and a second gas pressure source are necessary.

For the above mentioned purpose, a method is provided for bonding a first substrate to a second substrate using a bonding device comprising a first chuck with a first pressure port and a second chuck with a second pressure port. The method comprises the following steps:

a) placing the first substrate on the first chuck covering the first pressure port and fixing the edge portion of the first substrate to the first chuck, b) placing the second substrate on the second chuck covering the second pressure port and fixing the edge portion of the second substrate to the second chuck, c) supplying gas with a first gas pressure to the first pressure port and supplying gas with a second gas pressure to the second pressure port so that the substrates are deflected towards each other, and d) moving the first chuck and the second chuck relative to each other towards each other at least until the first substrate and the second substrate are in contact with one another, wherein the first gas pressure and the second gas pressure are controlled independently from one another.

The movement of the chucks may be stopped before the substrates are in full contact with one another. For example, the distance between the chucks is less than five times the thickness of one of the substrates when the movement is stopped.

The features and advantages discussed in context of the bonding device also apply to the method and vice versa. For example, a bonding device as describe above may be used in the method.

For example, the gas pressures are applied at the same time and/or the substrates and chucks are concentric to one another.

For a more accurate control of the deflection, the method may have the following further steps:

a) measuring at least one property of the first substrate and/or at least one property of the second substrate, in particular a mechanical property, like the nominal size and/or diameter of the respective substrate, the actual size and/or diameter of the respective substrate, the stiffness of the respective substrate, and/or an environmental property, like the temperature of the respective substrate, and b) controlling the first gas pressure and/or the second gas pressure depending on the at least one property of the first substrate, depending on the at least one property of the second substrate, or depending on the at least one property of the first substrate and the second substrate.

In an embodiment, contact portions of the substrates lie at the pressure port of the respective substrate, wherein the contact portions are subject to the largest deflection when the first gas pressure and the second gas pressure are applied, wherein the first substrate and the second substrate initially make contact with the respective contact portions, when the chucks are moved towards each other. Thus, it is assured that the initial contact and the initial bond is made by the contact portions.

In order to further reduce scale-distortions, during movement of the chucks, the first gas pressure and the second gas pressure is controlled such that the incident angle between the first substrate and the second substrate after the initial contact is held between 0.1° and 1.5°, in particular between 0.4° and 0.8°, and/or such that the incident angle is split evenly by the final flat plane between the substrates. The control unit for the first and/or second gas pressure may be programmable to change the respective pressure value during the propagation process of the bonding wave.

For example, the incident angle is kept constant during bonding. During bonding, the bonding wave may propagate radially outwards and thus the angle moves radially outwards.

For highly accurate results, the first pressure port and the second pressure port may be in alignment so that the contact portions are in alignment. The pressure ports may be at the center of the substrate.

Further, for above mentioned purpose, a bonding device for bonding substrates is provided, comprising a first chuck, a second chuck, a first gas pressure regulator, a movable first support element and a first actuator for the first support element. The first chuck comprises a first holding surface for holding a first substrate, the first holding surface having a first pressure port fluidically connected to the first gas pressure regulator. The first support element is mounted movably at least partially within the first pressure port such that the first actuator is able to move the first support element between a retracted position, in which the first support element does not protrude above the first holding surface, and an extended position, in which the first support element protrudes above the first holding surface towards the second chuck.

By virtue of the support element, the function of the gas pressure may be controlled and/or supported, improving the accuracy of the process even further.

The bonding device may also have at least one, for example all features of the bonding device as described above with the mentioned advantages and vice versa.

In an embodiment, the bonding device comprises a second gas pressure regulator, a second support element and a second actuator for the second support element. The second chuck comprises a second holding surface for holding a second substrate, the second holding surface having a second pressure port fluidically connected to the second gas pressure regulator. The second support element is mounted movably at least partially within the second pressure port such that the second actuator is able to move the second support element between a retracted position, in which the second support element does not protrude above the second holding surface, and an extended position, in which the second support element protrudes above the second holding surface towards the first chuck. This way, the initial point of bonding can be controlled even more accurately and with higher localized interface pressure to ensure adequate bond initiation.

The first actuator and/or second actuator may be an electric motor, a piezo actuator, a pneumatic actuator, and/or a hydraulic actuator.

The first support element and/or the second support element may be an elongated member, for example a pin.

In an aspect, the bonding device comprises a control unit being electrically and/or wirelessly connected to the first gas pressure regulator and the first actuator and/or to the second gas pressure regulator and the second actuator, the control unit being configured to control the first gas pressure regulator to supply gas with a first gas pressure to the first pressure port and configured to control the movement of the first support element via the first actuator and/or the control unit being configured to control the second gas pressure regulator to supply gas with a second gas pressure to the second pressure port and configured to control the movement of the second support element via the second actuator. In this manner, the bonding process may be controlled in detail.

In order to arrange both, the support element and the pressure port, at the same point, the first chuck and/or the second chuck may have an opening extending from the respective holding surface, in particular extending fully through the respective chuck, wherein a portion of the opening adjacent to the respective holding surface being the respective pressure port, in particular wherein the respective support element being mounted in the opening and a supply channel is provided extending from the portion forming the pressure port to a back surface or peripheral surface of the respective chuck.

The back surface is in particular opposite to holding surface.

The pressure regulator may be fluidically connected to supply channel to supply gas to the at pressure port.

In an embodiment, the first pressure port and/or the second pressure port are arranged at the center, in particular at the center of the area of the respective holding surface or chuck, and/or that the first pressure port and the second pressure port are in alignment, creating a rotational-symmetric deflection of each substrate and/or the best overlap of the substrates.

For a stable and secure process, the chucks, in particular the holding surface comprise holding means, in particular vacuum means, electrostatic means or mechanical clamping means, for fixation of a substrate.

To allow sufficient deflection, the holding means, in particular at least one vacuum groove, are provided at the edge portion of the respective holding surface.

The edge portion is in particular the area of the substrate and chuck, respectively, corresponding to the radially outer 5% to 20% of the radius.

The vacuums means may be connected to a vacuum source.

For supplying sufficient gas pressure, the bonding device comprises at least one gas pressure source, in particular wherein the at least one gas pressure source is fluidically connected to the first gas pressure regulator and the second gas pressure regulator.

For example, the gas pressure source, e.g. a compressor, is itself a pressure regulator. In this case, a first and a second gas pressure source are necessary.

Further, for above mentioned purpose, a method is provided, for bonding a first substrate to a second substrate using a bonding device, comprising a first chuck with a first pressure port and a first support element and a second chuck. The method comprises the following steps:
- a) placing the first substrate on the first chuck covering the first pressure port and fixing the edge portion of the first substrate to the first chuck,
- b) placing the second substrate on the second chuck and fixing the second substrate to the second chuck,
- c) supplying gas with a first gas pressure to the first pressure port so that the first substrate is deflected towards the second substrate,
- d) moving the first support element to an extended position, in which the first support element protrudes above the first chuck towards the second chuck, and
- e) moving the first chuck and the second chuck relative to each other towards each other at least until the first substrate and the second substrate are in contact with one another.

The movement of the chucks may be stopped before the substrates are in full contact with one another. For example, the distance between the chucks is less than five times the thickness of one of the substrates when the movement is stopped.

The features and advantages discussed in the above context of the embodiments of bonding devices and/or method also apply to the method and vice versa. For example, a bonding device as describe above may be used in the method.

To improve the accuracy of control of the point of initial contact even further, the method may have the following further steps:
- a) supplying gas with a second gas pressure to a second pressure port of the second chuck so that the second substrate is deflected towards the first substrate, and
- b) moving the second support element to an extended position, in which the second support element protrudes above the second chuck towards the first chuck.

The movement of the first and/or the second support element may occur simultaneously with supplying the gas at the respective pressure port or after the respective gas pressure has been established at the respective pressure port.

In an aspect of the invention, the first support element and/or the second support element is moved until it contacts the deflected first substrate or the deflected second substrate, respectively, wherein the amount of deflection of the respective substrate is measured based on the position of the support element, in particular wherein the respective gas pressure is adjusted based on the measured amount of deflection of the respective substrate. This allows a precise control of the movement of the support elements.

A closed-loop control for the first gas pressure and/or the second gas pressure using the respective support element may be set up.

In an embodiment, in particular after the initial contact of the substrates, the first support element is actuated to apply an additional mechanical pressure to the first substrate, and/or in particular after the initial contact of the substrates, the second support element is actuated to apply an additional mechanical pressure to the second substrate. The mechanical pressure ensures the initial bonding of the substrates. By applying the pressure locally, i.e. at the point engaged by the support element, the initial point of bonding and thus the origin of the bonding wave can be controlled accurately The mechanical pressure may exceed the respective gas pressure.

For example, both support elements may be actuated to apply the mechanical pressure.

It is also conceivable that only one of the support elements is moved and the other support element is locked in place, e.g. contacting and supporting the respective substrate.

Even though the mechanical pressure is applied, the deflection may be caused solely by the gas pressure.

In an aspect, the first support element and/or the second support element is retracted, in particular to a retracted position, after the mechanical pressure has been applied but before the substrates are in full contact with one another. This way, the support elements to not disturb the bonding process once the substrates are bonded in initially.

In its retracted position, the support element does not protrude above the surface of the respective chuck or above the respective holding surface.

In an embodiment, contact portions of the substrates lie at the respective pressure ports, wherein the contact portions are subject to the largest deflection when the first gas pressure and the second gas pressure are applied, wherein the first substrate and the second substrate initially make contact with the respective contact portions, when the chucks are moved towards each other. Thus, it is assured that the initial contact is made by the contact portions.

In order to further reduce scale-distortions, during movement of the chucks, the first gas pressure and the second gas pressure is controlled such that the incident angle between the first substrate and the second substrate after the initial contact is held between 0.1° and 1.5°, in particular between 0.4° and 0.8°, and/or such that the incident angle is split evenly by the final flat plane between the substrates. The control unit for the first and/or second gas pressure may be programmable to change the respective pressure value during the propagation process of the bonding wave.

For example, the incident angle is kept constant during bonding. During bonding, the bonding wave may propagate radially outwards and thus the angle moves radially outwards.

For highly accurate results, the first pressure port and the second pressure port may be in alignment so that the contact portions are in alignment. The pressure ports may be at the center of the substrate.

For the above purpose, a bonding device for bonding substrates is further provided. The bonding device comprises a first chuck, a first support structure, a second chuck and a second support structure. The first chuck is mounted to the first support structure such that the first chuck is thermally isolated form the first support structure, and the second chuck is mounted to the second support structure such that the second chuck is thermally isolated form the second support structure.

By thermally isolating the chucks, the temperature of the chucks may be controlled precisely to avoid scale distortions of the substrates due to different temperatures and/or different coefficients of thermal expansion as the substrates will assume the temperature of the chuck once placed on the chuck.

The bonding device may also have at least one, for example all features of the embodiments of the bonding device and/or methods as described above with the mentioned advantages and vice versa.

In an aspect, the first chuck and/or the second chuck is mounted to the respective support structure by means of mounting elements, wherein the first chuck and/or the second chuck are spaced apart from the respective support structure. This way, the thermal isolation between the chuck and the respective support structure is achieved by the distance, i.e. air, gas, vacuum between the chuck and the support structure.

To further reduce thermally caused scale distortion, the bonding device comprises at least one chuck tempering device configured to equalize the temperatures of the first chuck and the second chuck.

Within this disclosure, equalizing means reducing the temperature difference to less than 1° C., in particular less than 0.5° C., in particular less than 0.1° C.

In an embodiment, the first chuck and the second chuck each comprise at least one tempering channel, wherein the chuck tempering device comprises a tempering circuit including the at least one tempering channel of the first chuck and the at least one tempering channel of the second chuck in the same tempering circuit, ensuring that the chucks are thermally equalized.

Alternatively or in addition, the first chuck and/or the second chuck comprise a heating element, in particular a closed-loop heating element, simplifying the bonding device.

In order to avoid a temperature difference between the chucks and/or substrates, the bonding device may comprise a gas tempering device. The first chuck comprises a first holding surface for holding a first substrate, the first holding surface having a first pressure port fluidically connected to the gas tempering device. The second chuck comprises a second holding surface for holding a second substrate, the second holding surface having a second pressure port fluidically connected to the gas tempering device.

In an aspect, the gas tempering device comprises a tempering material with at least one channel, the at least one channel being fluidically connected to the first pressure port and/or the second pressure port. Guiding the gas through the same tempering material ensures that the gas directed to the first pressure port and the second pressure port has the same temperature.

For controlling the temperature of the gas and/or the chuck, the first chuck and/or the second chuck comprises a temperature sensor associated with the respective pressure port of the respective chuck.

In an embodiment, the first pressure port and/or the second pressure port are arranged at the center, in particular at the center of the area of the respective holding surface or chuck, and/or that the first pressure port and the second pressure port are in alignment, creating a rotational-symmetric deflection of each substrate and/or the best overlap of the substrates.

For a stable and secure process, the chucks, in particular the holding surface, comprise holding means, in particular vacuum means, electrostatic means, or mechanical clamping means for fixation of a substrate.

To allow sufficient deflection, the holding means, in particular at least one vacuum groove, are provided at the edge portion of the respective holding surface.

The edge portion is in particular the area of the substrate and chuck, respectively, corresponding to the radially outer 5% to 20% of the radius.

The vacuums means may be connected to a vacuum source.

For supplying sufficient gas pressure, the bonding device comprises at least one gas pressure source, in particular wherein the at least one gas pressure source is fluidically connected to the first gas pressure regulator and the second gas pressure regulator.

For example, the gas pressure source, e.g. a compressor, is itself a pressure regulator. In this case, a first and a second gas pressure source are necessary.

For above mentioned purpose, further a method is provided for bonding a first substrate to a second substrate using a bonding device, comprising a first chuck and a second chuck. The method comprises the following steps:
a) equalizing the temperatures of the first chuck and the second chuck,
b) placing the first substrate on the first chuck and fixing the first substrate to the first chuck,
c) placing the second substrate on the second chuck and fixing the second substrate to the second chuck, and
d) moving the first chuck and the second chuck relative to each other towards each other at least until the first substrate and the second substrate are in contact with one another.

The movement of the chucks may be stopped before the substrates are in full contact with one another. For example, the distance between the chucks is less than five times the thickness of one of the substrates when the movement is stopped.

The features and advantages discussed in the above context of the embodiments of bonding devices and methods also apply to the method and vice versa. For example, a bonding device as describe above may be used in the method.

For example, the equalizing and/or tempering continues at least until the substrates are placed onto the chucks, in particular until the substrates made initial contact or until the substrates are fully bonded.

In order to equalize the chucks in a simple and efficient way, the first chuck and the second chuck are moved towards each other until the chucks directly contact each other, in particular wherein the chucks are held in contact at least until their temperatures are equalized.

For a very precise temperature equalization, the temperatures of the first chuck and of the second chuck are equalized using a chuck tempering device.

In an aspect, equalizing is carried out by circulating a tempering fluid through at least one tempering channel of the first chuck and at least one tempering channel of the second chuck using the same tempering circuit of the chuck tempering device. In this manner, a very precise equalization is carried out.

In addition or alternatively, equalizing is carried out by heating the first chuck and/or the second chuck using a heating element of the chuck tempering device, in particular a closed-loop heating element, in the respective chuck. Thus, the bonding device may be simplified.

In an embodiment, the first chuck comprises a first pressure port and/or the second chuck comprises a second pressure port, wherein gas with a first gas pressure is supplied to the first pressure port and/or gas with a second gas pressure is supplied to the second pressure port so that the substrates are deflected towards each other, reducing bonding inaccuracies.

In an aspect, the gas is tempered prior to reaching the respective pressure port, in particular by contact with the respective chuck, reducing temperature differences caused by the gas.

For precise tempering, the gas is tempered by a gas tempering device, wherein the gas directed to the first pressure port and the second pressure port passes through a common gas tempering material of the gas tempering device, in particular the temperature of the common gas tempering material being controlled.

Tempering is performed in particular such that gas at the first pressure port and at the second pressure port have equal temperatures.

In another aspect, the bonding device comprises at least two gas temperature sensors, wherein each of the gas temperature sensors is associated with the first pressure port or the second pressure port, wherein the gas temperature sensors measure the temperature of the gas directed to the respective associated pressure port. In this manner, the temperature difference and e.g. scale distortion may be reduced even further.

For controlling the temperature of the chuck closely, the bonding device may comprise at least two chuck temperature sensors, wherein each of the chuck temperature sensors is associated with the first chuck or the second chuck, wherein the chuck temperature sensors measure the temperature of the respective chuck.

In an embodiment, the first gas pressure and the second gas pressure are controlled based on the measured temperature of the gas directed to the first pressure port, of the gas directed to the second pressure port, of the measured temperature of the first chuck, of the measured temperature of the second chuck or a combination of any of the temperatures. This way, the precision of bonding may be increased even further.

In an embodiment, contact portions of the substrates lie at the respective pressure ports, wherein the contact portions are subject to the largest deflection when the first gas pressure and/or the second gas pressure are applied, wherein the first substrate and the second substrate initially make contact with the respective contact portions, when the chucks are moved towards each other. Thus, it is assured that the initial contact is made by the contact portions.

In order to further reduce scale-distortions, during movement of the chucks, the first gas pressure and the second gas pressure is controlled such that the incident angle between the first substrate and the second substrate after the initial contact is held between 0.1° and 1.5°, in particular between 0.4° and 0.8°, and/or such that the incident angle is split evenly by the final flat plane between the substrates. The control unit for the first and/or second gas pressure may be programmable to change the respective pressure value during the propagation process of the bonding wave.

For example, the incident angle is kept constant during bonding. During bonding, the bonding wave may propagate radially outwards and thus the angle moves radially outwards.

For highly accurate results, the first pressure port and the second pressure port may be in alignment so that the contact portions are in alignment.

The pressure ports may be at the center of the substrate.

Further features and advantages will be apparent from the following description as well as the accompanying drawings, to which reference is made. In the drawings.

Figure 1:
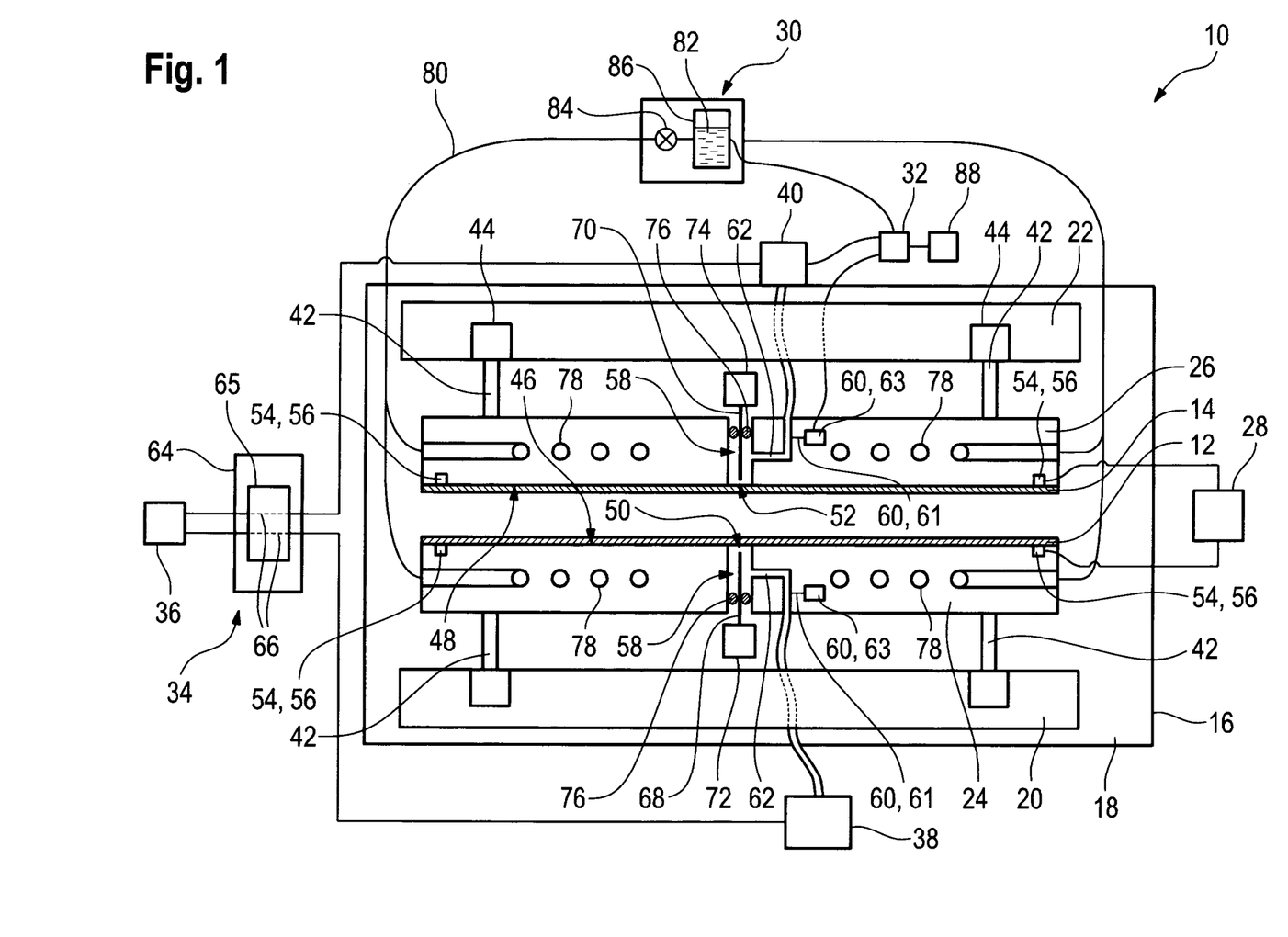
FIG. 1 shows a bonding device according to the invention schematically.

FIG. 1 shows schematically a bonding device 10 for bonding a first substrate 12 to a second substrate 14.

The bonding device 10 is, for example, a bonding device for fusion bonding or direct bonding. The substrates 12, 14 may be wafers, for example made out of a semiconductor, in particular silicon.

One or both of the substrates 12, 14 may have structures like micro- or nanostructures, in particular on the surface facing the other substrate 12, 14.

The bonding device 10 comprises a housing 16 defining a process chamber 18 within. In the process chamber 18 of the bonding device 10, a first support structure 20, a second support structure 22, a first chuck 24 and a second chuck 26 are arranged.

The chucks 24, 26 are parallel to each other, even if moved vertically. Further, the chucks 24, 26 may be concentric to one another.

The chucks 24, 26 may be circular and/or have a diameter for accommodating 100 mm, 150 mm, 200 mm, 300 mm and/or 450 mm substrates or wafers.

The words "first" and "second" are used in the context of the invention to delimit different subcomponents from one another. This does not necessarily mean that if a component comprises a second subcomponent, that the component actually comprises two of the subcomponents.

The bonding device 10 further comprises outside of the process chamber 18 a vacuum source 28, a chuck tempering device 30, a control unit 32, a gas tempering device 34, a pressure source 36, a first gas pressure regulator 38 and a second gas pressure regulator 40.

It is of course conceivable that one or more of the aforementioned components are arranged inside the process chamber 18. For example, the first gas pressure regulator 38 and the second gas pressure regulator 40 may be arranged in the process chamber 18, in particular close or in the respective chuck 24, 26 for a more accurate gas pressure control.

The first chuck 24 and the first support structure 20 form a lower unit of the bonding device 10. Likewise, the second chuck 26 and the second support structure 22 form an upper unit of the bonding device 10. The upper unit is arranged above the lower unit, wherein the chucks 24, 26 are facing each other.

The upper unit and the lower unit may comprise mounting elements 42, for example rods, by means of which the first chuck 24 is mounted to the first support structure 20 and the second chuck 26 is mounted to the second support structure 22.

For example, the mounting elements 42 are of a material with low thermal conductivity.

Due to the mounting elements 42, the chucks 24, 26 are spaced apart from the respective support structure 20, 22. Thus, they are not in direct contact with the respective support structure 20, 22.

Due to the gap between the chucks 24, 26 and the respective support structure 20, 22 the chucks 24, 26 are thermally isolated from the respective support structure 20, 22.

In the gap, the atmosphere of the process chamber 18 may be present. The atmosphere may be air, gas, like nitrogen, or a vacuum.

In the embodiment of FIG. 1, the upper unit further comprises chuck actuators 44 coupled to the mounting elements 42. By means of the chuck actuators 44, the second chuck 26 may be moved vertically towards the first chuck 24.

Thus, the first chuck 24 and the second chuck 26 are moveable relative to each other.

The support structures 20, 22 may in turn be mounted to the housing 16.

The chucks 24, 26 each comprise a holding surface with at least one pressure port on the surface facing the other chuck 26, 24. I.e. the first chuck 24 has a first holding surface 46 with a first pressure port 50, the second chuck 26 has a second holding surface 48 with a second pressure port 52.

It is of course conceivable, that a bonding device 10 according to the invention may only have one chuck 24, 26 provided with a pressure port and a support element.

The pressure ports 50, 52 are, for example, arranged at the center of the area of the respective holding surface 46, 48 or chuck 24, 26. For example, the first pressure port 50 and the second pressure port 52 are in alignment with one another.

The chucks 24, 26 further comprise, at their respective holding surfaces 46, 48 holding means 54 for fixation of a substrate 12, 14.

In the embodiment shown in FIG. 1, the holding means 54 are vacuum means being at least one vacuum groove 56 located at the radial outer edge portion of the holding surfaces 46, 48.

For example, the edge portion is defined as the portion corresponding to the radially outer 5% to 20% of the radius of the chuck 24, 26. The holding means 54, here the vacuum grooves 56, are fluidically connected to the vacuum source 28.

In the chucks 24, 26, an opening 58 is provided, wherein the opening 58, for example, extends through the entire thickness of the respective chuck 24, 26.

The opening 58 may be at the center of area of the chuck 24, 26 and opens to the respective holding surface 46, 48.

The portion of the opening 58 that opens to the respective holding surface 46, 48, i.e. the portion adjacent to the holding surface 46, 48, forms the respective pressure port 50, 52 of the chuck 24, 26.

For each chuck 24, 26, a temperature sensor 60 is provided associated with a respective pressure port 50, 52. For example, the temperature sensor 60 is provided at the portion of the opening 58 adjacent to the holding surface 46, 48.

The temperature sensor 60 may include or be a gas temperature sensor 61. The gas temperature sensor 61 is, for example, arranged at or in the respective pressure port 50, 52.

Alternatively or in addition, the temperature sensor 60 may include or be a chuck temperature sensor 63 adapted to measure the temperature of the chuck.

In each chuck 24, 26, a supply channel 62 extends from the opening 58 to the back surface of the respective chuck 24, 26, the back surface being the surface of the chuck 24, 26 facing away from the other chuck 26, 24.

It is of course conceivable that the supply channel 62 extends to a peripheral surface of the respective chuck 24, 26.

At the back surface, the supply channels 62 are fluidically connected to the pressure regulator 38, 40 associated with the respective chuck 24, 26. Thus, the supply channel 62 of the first chuck 24 is fluidically connected to the first gas pressure regulator 38, and the supply channel 62 of the second chuck 26 is fluidically connected to the second gas pressure regulator 40.

The pressure regulators 38, 40 are in turn fluidically connected to the gas tempering device 34 and finally to the pressure source 36.

The gas tempering device 34 comprises a tempering module 64 and tempering material 65 having two channels 66.

The fluidic connection from the pressure source 36 to the first gas pressure regulator 38 and the fluidic connection from the pressure source 36 to the second gas pressure regulator 40 are each provided by one of the channels 66.

Of course, it is also conceivable that the tempering material 65 only comprises one channel and that the fluidic connection towards the first gas pressure regulator 38 and the second gas pressure regulator 40 forks or splits on the way to the pressure regulators 38, 40 after having passed the tempering material 65.

The upper unit and the lower unit each comprise at least one support element, i.e. a first support element 68 and a second support element 70, respectively. Further, a first actuator 72 and a second actuator 74 are provided for the first support element 68 and the second support element 70, respectively.

The actuators 72, 74 may be mounted in or at the respective chuck 24, 26 or in or at the respective support structure 20, 22, and may be for example an electric motor, a piezo actuator, a pneumatic actuator, and/or a hydraulic actuator.

The support elements 68, 70 are located, at least partially, within the opening 58 of the respective chuck 24, 26. The support elements 68, 70 may be elongated elements, like pins.

The support elements 68, 70 are mounted moveably in the opening 58, for example by means of a bearing 76.

The supply channel 62 extends from the opening 58 between the pressure port 50, 52 and the bearing 76.

The first support element 68 and the second support element 70 are arranged vertically and on the same line.

Figure 2:
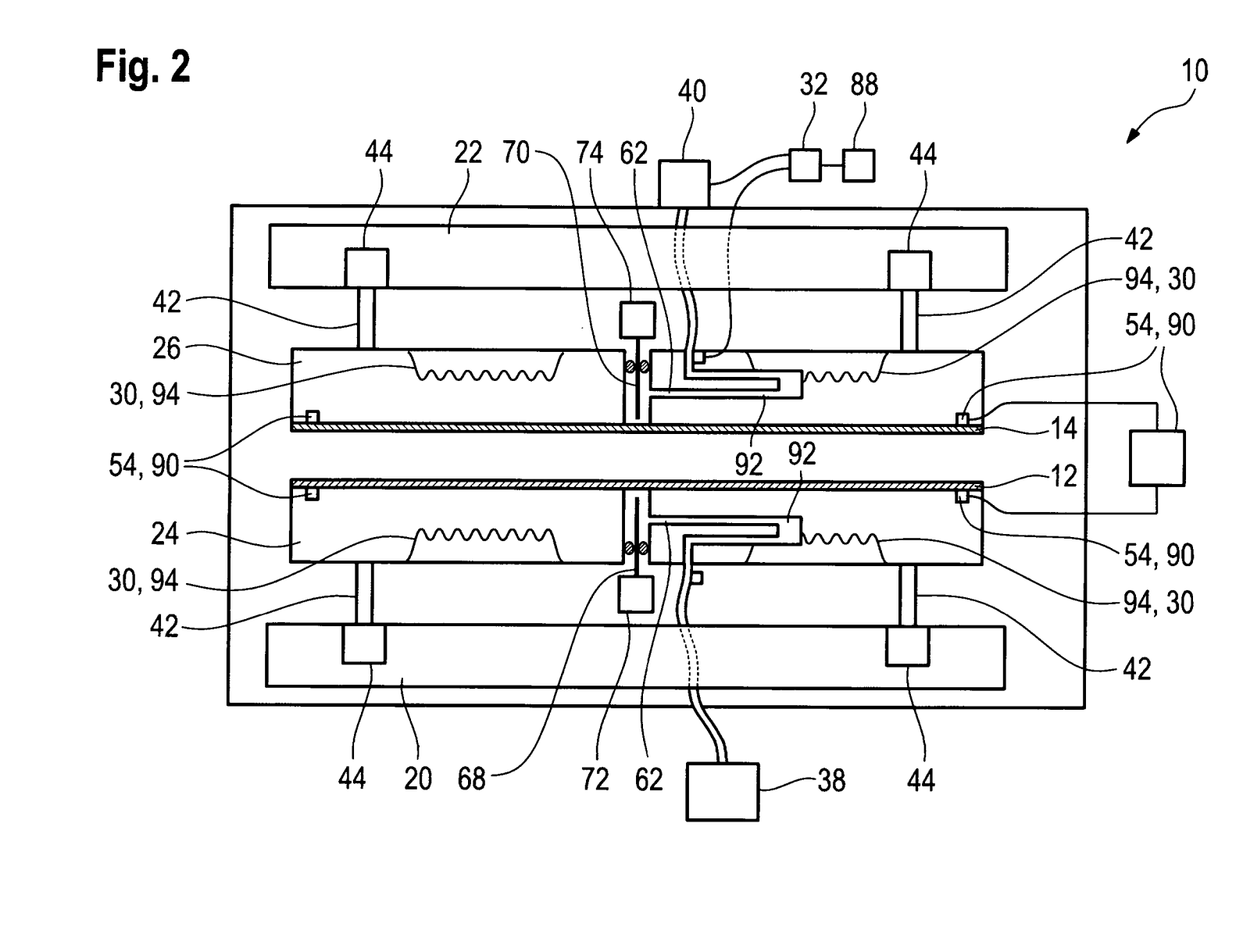
FIG. 2 shows a second embodiment of a bonding device according to the invention.

The support elements 68, 70 may assume a retracted position, as shown in FIGS. 1 and 2, in which the support elements 68, 70 do not protrude above the respective holding surface 46, 48 or chuck 24, 26.

Further, the support elements 68, 70 may be moved by the actuators 72, 74 into an extended position, in which the support elements 68, 70 partially protrude above the respective holding surfaces 46, 48.

There are of course more than one, in particular a continuum of extended positions.

In the first embodiment shown in FIG. 1, the chucks 24, 26 further comprise at least one tempering channel 78 each that is in fluidic connection with the chuck tempering device 30.

The tempering channels 78 may extend through the entire respective chuck 24, 26, for example in a spiral form or a plurality of circles.

The chuck tempering device 30 comprises a tempering circuit 80 with tempering fluid 82, a fluid pump 84 and a fluid tempering module 86.

The tempering circuit 80 includes the tempering channels 78 so that both at least one tempering channels 78 are included in the same tempering circuit 80.

The tempering fluid 82 within the tempering circuit 80 is tempered by the fluid tempering module 86 and may be pumped through the tempering circuit 80 via the fluid pump 84.

The control unit 32 is electrically and/or wirelessly connected with the vacuum source 28, the chuck tempering device 30, the gas tempering device 34, the pressure source 36, the pressure regulators 38, 40, the chuck actuators 44, the temperature sensor 60 and/or the first and second actuator 72, 74. The control unit 32 is configured to control all or each of these components.

The control unit 32 has access to a database containing properties of the substrates 12, 14. The database may be located, i.e. stored, within the control unit 32 or on a server to which the control unit 32 has access.

In addition or alternatively, the control unit 32 comprises a user interface 88 for receiving user input comprising the property of the substrates 12, 14 located at the chucks 24, 26.

FIG. 2 shows schematically a second embodiment of the bonding device 10. The bonding device 10 of the second embodiment corresponds in general to the bonding device 10 of the first embodiment so that only aspects that differ are discussed in the following. Same and functionally the same components are labeled with the same reference numerals.

A first difference between the first embodiment of the bonding device 10 and the second embodiment of the bonding device 10 is the aspect that the holding means 54 are provided as electrostatic holding means 90. The electrostatic holding means 90 may also be located at an edge portion of the respective chuck 24, 26.

Of course, the holding means 54 could also be mechanical clamping means.

A second different aspect concerns the pressure regulators 38, 40. In the second embodiment, the pressure regulators 38 and 40 are each a pressure source, like a compressor.

In other words, two pressure sources 36 are provided, being the first gas pressure regulator 38 and the second gas pressure regulator 40, respectively.

Further, in difference to the first embodiment, the gas tempering device is a passive device including the supply channel 62 of the chucks 24, 26.

The supply channels 62 having, in this second embodiment, tempering portions 92. The tempering portions 92 extend the length of the supply channel 62 longer than the distance necessary to simply connect the pressure ports 50, 52 to the respective pressure regulators 38, 40 directly and/or efficiently.

Further, in difference to the first embodiment, also the lower unit comprises chuck actuators 44, so that also the first chuck 24 may be moved vertically, i.e. upwards, towards the second chuck 26.

In yet another different aspect, the chuck tempering device 30 comprises heating elements 94 located within both chucks 24, 26 for tempering the chucks 24, 26. The chuck tempering devices may be closed-loop controlled devices.

Of course, it is possible, that the bonding device 10 according to the invention may comprise a combination of the features of the first and second embodiment.

For example, the bonding device 10 may be provided according to the first embodiment but with one or more of the abovementioned aspects of the second embodiment implemented.

In FIGS. 3a to 3g, the method for bonding the substrates 12, 14 with a bonding device 10 according to the invention is illustrated. In FIGS. 3a to 3g, only the chucks 24, 26 and support elements 68, 70 are shown and in lesser detail than before, in order to clarify the method.

Figure 3A:
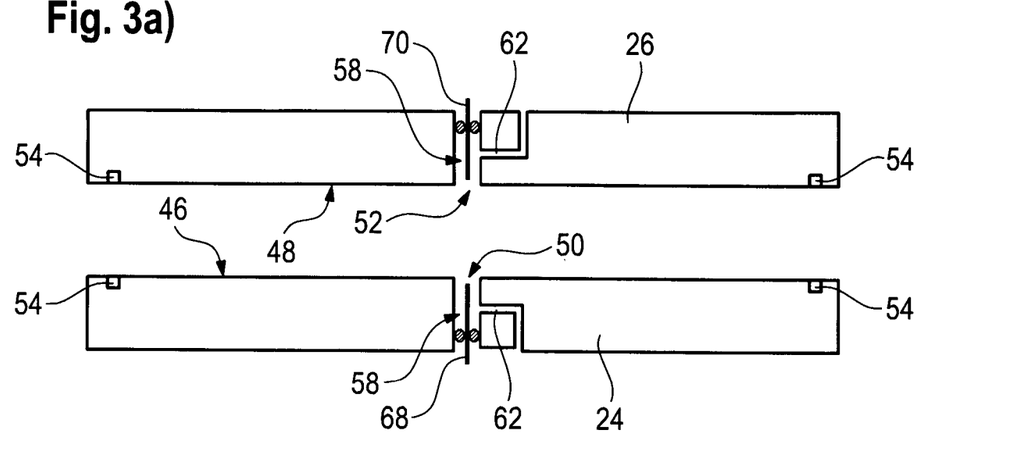
FIGS. 3a to 3g show chucks of the bonding device according to FIG. 1 or FIG. 2 during various steps of the method according to the invention.

The initial position of the bonding device 10 is shown in FIG. 3a. Both chucks 12, 14 are separated from one another and the support elements 68, 70 are in their retracted position.

No substrate 12, 14 is present at the chucks 24, 26, yet.

In an embodiment of the method, before the substrates 12, 14 are placed on the chucks 24, 26, the temperature of the chucks 24, 26 is equalized meaning that the temperature difference between the first chuck 24 and the second chuck 26 is reduced to less than 1° C., in particular less than 0.5° C. For example, the temperature difference may be less than 0.1° C.

In other words, the first chuck 24 and the second chuck 26 are brought into thermal equilibrium.

In order to equalize the temperatures, the chuck tempering device 30 controls the temperature of the chucks 24, 26 to the same temperature. The chuck tempering device 30 may in turn be controlled by the control unit 32.

Thus, the chuck tempering device 30 heats one or both of the chucks 24, 26 using the heating elements 94, in particular in closed-loop fashion.

Alternatively or in addition, the chuck tempering device 30 activates the fluid pump 84 of the common tempering circuit 80 so that tempered tempering fluid 82 circulates through the at least one tempering channel 78 of both chucks 24, 26. Thus, the chucks 24, 26 reach the same temperature, as the tempering fluid 82 is the same in both chucks 24, 26 as the chucks 24, 26 are part of the same tempering circuit 80.

The equalization of the chucks may be controlled using the chuck temperature sensors 63.

Figure 3B:
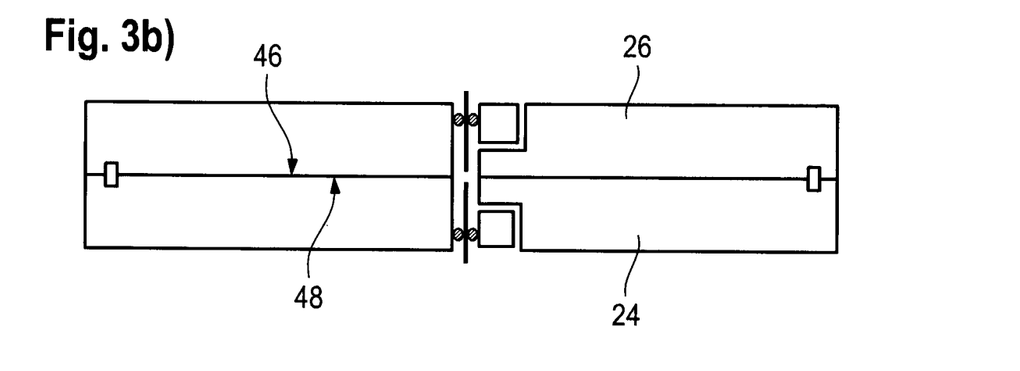

Further, as a bonding device according to the invention may also be provided without a chuck tempering device 30, the temperatures of the first chuck 24 and the second chuck 26 may also be equalized by moving the chucks 24, 26 towards each other until direct contact of the chucks 24, 26 is achieved (see FIG. 3b).

Movement is effected by the chuck actuators 44 and controlled via the control unit 32.

The chucks 24, 26 are held in the direct contact with one another until the temperatures of the chucks 24, 26 have been equalized. The temperatures of the chucks 24, 26 may be measured using the temperature sensors 60, in particular the chuck temperature sensors 63.

Of course, the chucks 24, 26 may also be brought in direct contact with one another even if a tempering device 30 is present. This speeds up the equalizing step.

Once the temperatures of the chucks 24, 26 have been equalized, i.e. the difference in temperature is smaller than 1° C., in particular smaller than 0.5° C., for example smaller than 0.1° C., the chucks 24, 26 are moved away from each other.

The bonding device 10 may then be loaded with the substrates 12, 14.

Figure 3C:
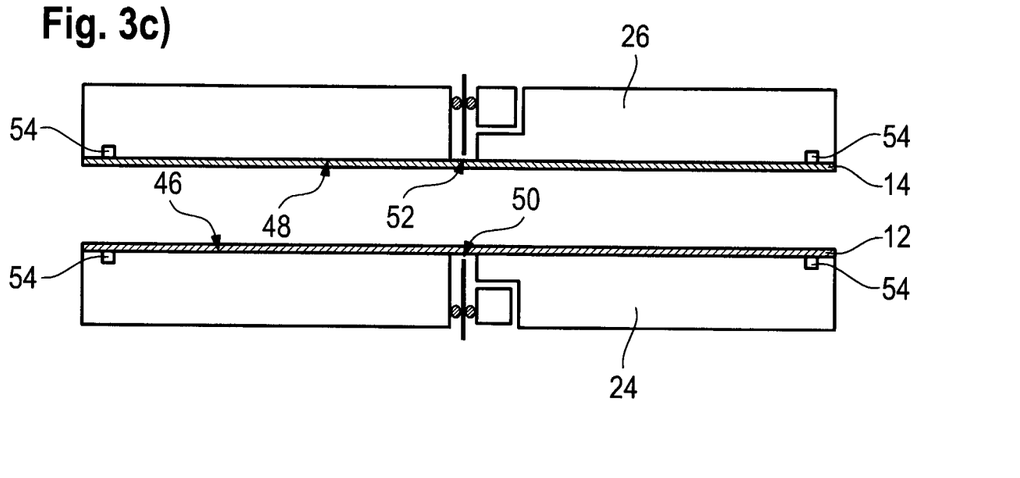

As seen in FIG. 3c, the first substrate 12 is placed on the first holding surface 46 of the first chuck 24, and the second substrate 14 is placed on the second holding surface 48 of the second chuck 26.

The substrates 12, 14 are arranged concentric to one another and concentric to the chucks 24, 26.

Once the substrates 12, 14 have been placed on the holding surfaces 46, 48, the holding means 54 are activated.

Thus, the vacuum source 28 may apply a vacuum to the vacuum grooves 56 or the electrostatic holding means 90 may be powered.

As a result, the first substrate 12 is fixed at its edge portion to the edge portion of the first holding surface 46, and the second substrate 14 is fixed at its edge portion to the edge portion of the second holding surface 48.

Before or while placing the substrates 12, 14 in the bonding device 10, properties of the substrates 12, 14 may be measured and provided to the control unit 32.

This may be done by inputting the measured properties to the control unit 32 via the user interface 88 or by storing the measured properties in the database.

The properties of the substrates 12, 14 may include mechanical properties like the nominal size and/or nominal diameter of the respective substrate 12, 14, the actual size, and/or diameter of the respective substrate 12, 14, the stiffness of the respective substrate 12, 14. Further, the properties of the substrate 12, 14 may also include environmental properties, like the temperature of the respective substrate 12, 14.

Depending on at least one of the measured properties, the control unit 32 controls the pressure source 36 and/or the pressure regulators 38, 40 to provide gas, for example compressed air or nitrogen, having a first gas pressure at the first pressure port 50 and gas, for example compressed air or nitrogen, having a second gas pressure at the second pressure port 52. For example, the pressures are applied at the same time. The gas flow is illustrated by arrows in FIGS. 3d, 3e and 3f.

The measurements of the temperature sensor 60, in particular the chuck temperature sensor 63, may be used by the control unit 32 to determine the first and second gas pressure.

For example, the first gas pressure of the gas at the first pressure port 50 is determined on the properties of the first substrate 12, and the second gas pressure of the gas at the second pressure port 52 is chosen based on the properties of the second substrate 14.

Of course, the properties of both substrates 12, 14 may be used to determine the first gas pressure and the second gas pressure.

The first gas pressure and the second gas pressure may therefore and are most likely be different from one another, meaning that the control unit 32 controls the first gas pressure regulator 38 and the second gas pressure regulator 40 independently from one another.

In order not to increase the temperature difference between the first chuck 24 and the second chuck 26 and thus the first substrate 12 and the second substrate 14, the gas applied to the first pressure port 50 and the second pressure port 52 is thermally equalized as well using the gas tempering device 34, i.e. the gas is tempered prior to reaching the respective pressure port 50, 52.

This may be done in a bonding device 10 according to the first embodiment, by the tempering material 65 through which the gas directed to the first pressure port 50 and the gas directed to the second pressure port 52 is guided. Because the gas flow directed to the first pressure port 50 and the gas flow directed to the second pressure port 52 flow through the same tempering material 65, which is held at a constant temperature by the tempering module 64, both gas flows have the same temperature.

Alternatively or in addition, in a bonding device 10 according to the second embodiment, the gas is directed through the chucks 24, 26 for tempering. Because of the long way the gas has to travel through the chuck 24, 26 in particular due to the tempering portion 92 of the supply channel 62, the gas assumes the temperature of the respective chuck 24, 26. Because the chucks 24, 26 are temperature equalized, also the gas directed to the first and second pressure port 50, 52 is thermally equalized and thus tempered.

The temperature of the gas at the pressure ports 50, 52 may also be measured using the temperature sensor 60.

The tempering and/or equalizing of the temperatures, i.e. the function of the gas tempering device 34 and the chuck tempering device 30, continues at least until the substrates 12, 14 are placed onto the chucks 24, 26, for example until the substrates made initial contact and/or initial bond. More preferably, the equalizing and tempering continues until the substrates 12, 14 are fully bonded.

Figure 3D:
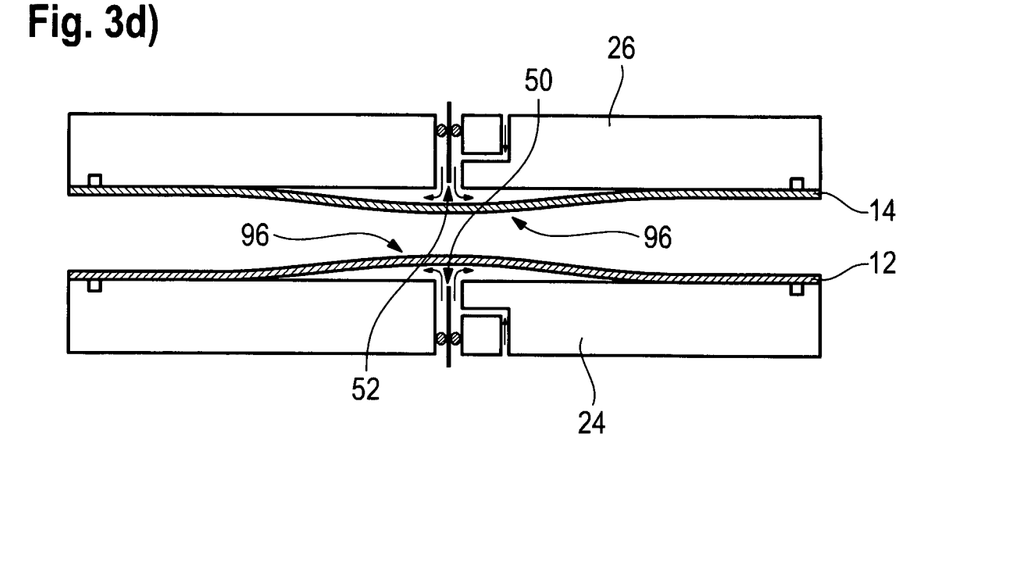

As can be seen in FIG. 3d, the substrates 12, 14 are deflected towards each other above the respective pressure ports 50, 52. The amount of the deflection, i.e. the displacement depends on the first gas pressure or the second gas pressure, respectively.

The portions that lie vertically above or below the pressure ports 50, 52 form contact portions 96 of the substrate and are subject to the largest deflection.

As the pressure ports 50, 52 are in alignment, the contact portions 96 are in alignment as well.

In particular, the first and second gas pressures are chosen such that the deflection of the substrates 12, 14 is equal and/or that the contact portions 96 are congruent.

Simultaneously to, or preferably after the first and second gas pressure have been applied, the first support element 68 and the second support element 70 are moved vertically to protrude above the respective holding surface 46, 48, i.e. they are moved into their extended position.

The support elements 68, 70 are moved until they contact the respective deflected substrate 12, 14, more precisely the contact portion 96 of the respective substrate 12, 14.

The actuator 72, 74 or a suitable sensor may determine the amount that the support elements 68, 70 have been moved so that the amount of the deflection of the respective contact portion 96 may be measured. The amounts of deflection may be different for the first and second substrate 12, 14.

Based on the measurement of the deflection, the first and/or the second gas pressure may be adjusted by the control unit 32. Thus, a closed-loop control may be achieved.

Figure 3E:
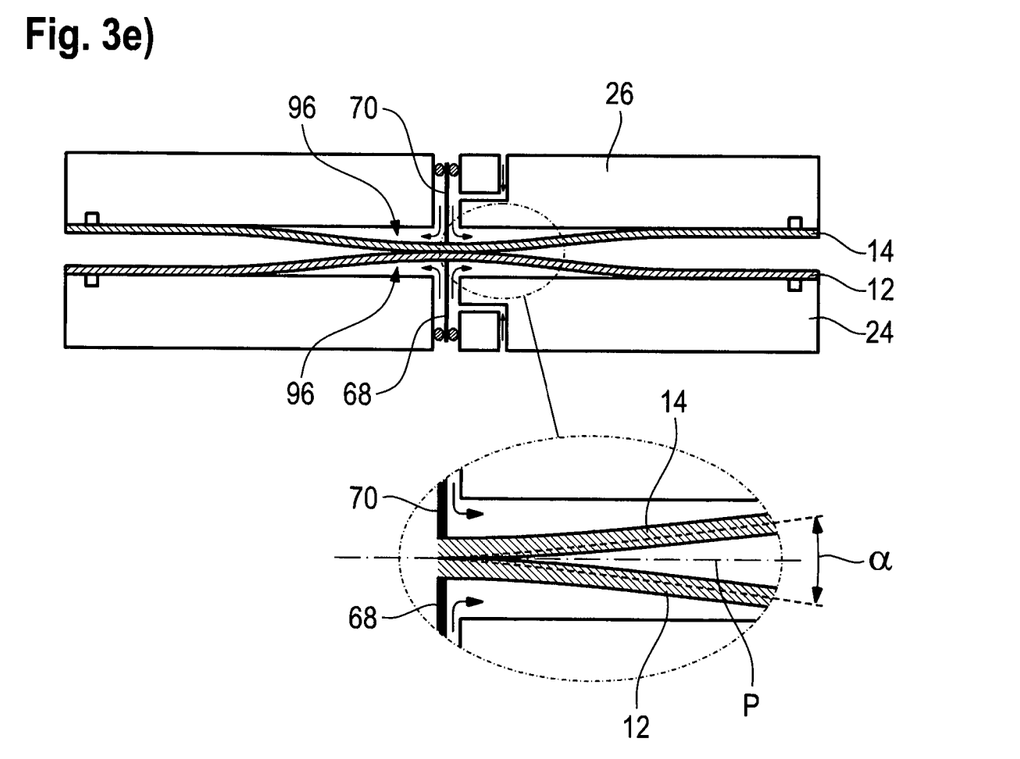

In the next step, shown in FIG. 3e, the chucks 24, 26 are moved towards each other, either by moving only one chuck or both chucks, until the contact portions 96 come in contact with one another, i.e. until initial contact has been made.

It is important to understand that contact does not necessarily mean that the substrates bond to each other, i.e. the initial contact and the initial bonding occur at different points in time.

Slightly before, at or after the initial contact of the substrates 12, 14 has been made, one or both support elements 68 are actuated by the respective actuator 72, 74 to apply mechanical pressure to the respective substrate 12, 14.

By applying an additional mechanical pressure in addition to the gas pressure, it is ensured that the substrates 12, 14 start bonding at the location between the support elements 68, 70, being preferably the center of the substrates 12, 14. The mechanical pressure exceed the respective gas pressure.

It is of course conceivable, that only one of the support elements 68, 70 is actuated and the other support element 70, 68 is locked in place but contacting the respective substrate.

It is worth noting, that for example, the mechanical pressure applied by the support elements 68, 70 does not lead to further deflection but is only used for ensuring initial bonding. The deflection is caused solely by the gas pressure.

Once the substrates 12, 14 are initially bonded, a so-called bonding wave or bond front forms. The substrates 12, 14 at the bonding wave have an incident angle α as can be seen in the enlarged portion of FIG. 3e.

The incident angle α extends on both sides of a plane P defined by the already bonded portions of the substrate 12, 14. This plane P is called final flat plane in the context of this invention.

The chucks 24, 26 are moved further towards each other while the control unit 32 controls the first gas pressure and the second gas pressure such that the incident angle α between the first substrate 12 and the second substrate 14 is held between 0.1° and 1.5°, in particular between 0.4° and 0.8°. In particular, the incident angle α is kept constant.

Further, the control unit 32 controls the first gas pressure different from the second gas pressure so that the incident angle α is split evenly by the final flat plane P.

Figure 3F:
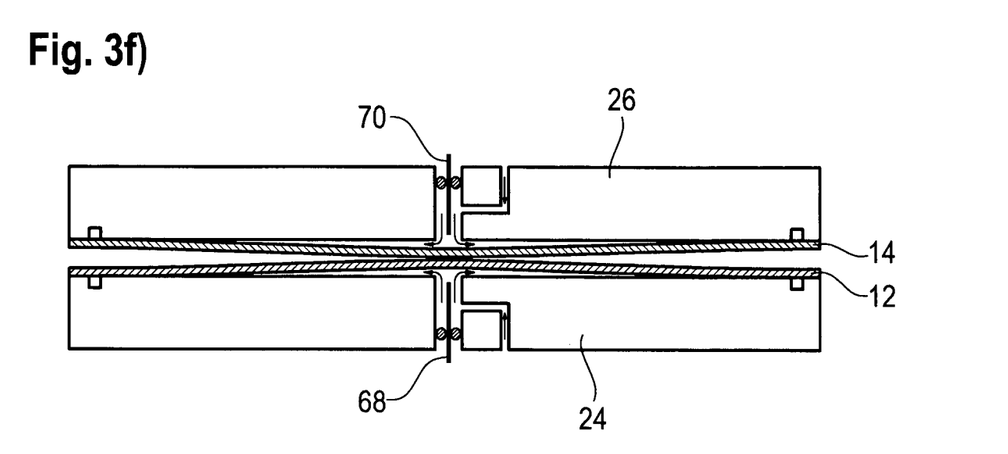

As the chucks move, also the bonding wave propagates radially outwards and thus the incident angle moves radially outwards (see FIG. 3f).

Of course, the control unit 32 may be programmable to change the values of the first and/or the second gas pressure during the propagation process.

The support elements 68, 70 are retracted by the actuator 72, 74 to the retracted position, after initial bonding has occurred but before the substrates 12, 14 are in full contact with one another.

Figure 3G:
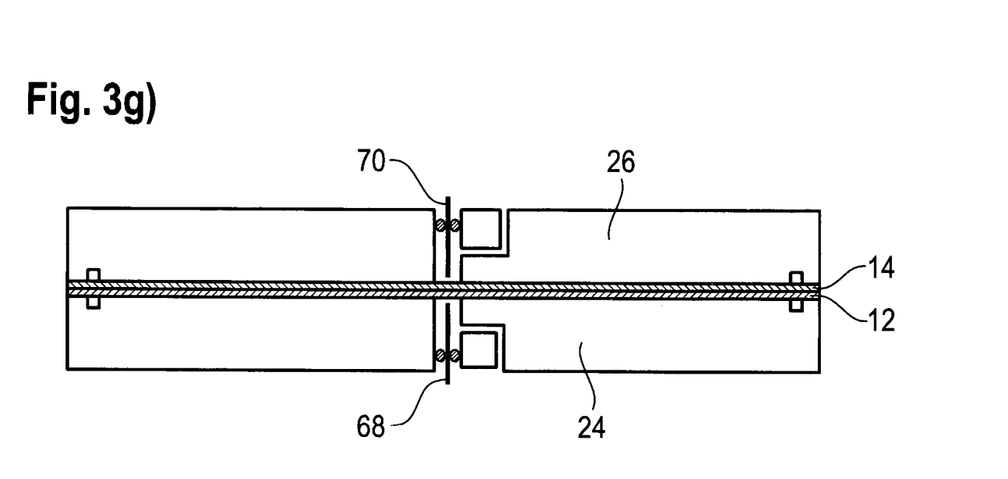

The movement of the chucks 24, 26 and the control of the gas pressures continues until the substrates 12, 14 are nearly in full contact with one another. The movement of the chucks 24, 26 is then stopped, but the bonding wave keeps propagating until the substrates 12, 14 are fully bonded (FIG. 3g).

For example, the distance between the chucks 24, 26 is less than five times the thickness of the substrates 12, 14 when the movement is stopped.

Bonding is then completed. Thus, the chucks 24, 26 may then be moved away from each other, the holding means 54 may be deactivated, the gas supply may be stopped and the bonded substrates 12, 14 may be removed from the bonding device 10.

Due to the use of the support elements 68, 70, it can be assured that the point where the substrates 12, 14 bond initially lies at the desired location, i.e. in the center of the substrates 12, 14.

Further, due to the thermal equilibrium between the chucks 24, 26 and thus the substrates 12, 14, distortions due to a thermal expansion can also be eliminated.

In addition, due to the differential control of the first pressure independently of the second gas pressure, the incident angle may be held as desired and symmetric around the plane P. Either one and in particular all of the three factors lead to a highly precise bonding of the first substrate 12 to the second substrate 14.

The invention claimed is:

1. A bonding device for bonding substrates, comprising a first chuck, a second chuck, a first gas pressure regulator, a movable first support element and a first actuator for the first support element,
   wherein the first chuck comprises a first holding surface for holding a first substrate, the first holding surface having a first pressure port fluidically connected to the first gas pressure regulator,
   wherein the first support element is mounted movably at least partially within the first pressure port such that the first actuator is able to move the first support element between a retracted position, in which the first support element does not protrude above the first holding surface, and an extended position, in which the first support element protrudes above the first holding surface towards the second chuck.

2. The bonding device according to claim 1, wherein the bonding device comprises a second gas pressure regulator, a second support element and a second actuator for the second support element,
   wherein the second chuck comprises a second holding surface for holding a second substrate, the second holding surface having a second pressure port fluidically connected to the second gas pressure regulator,
   wherein the second support element is mounted movably at least partially within the second pressure port such that the second actuator is configured to move the second support element between a retracted position, in which the second support element does not protrude above the second holding surface, and an extended position, in which the second support element protrudes above the second holding surface towards the first chuck.

3. The bonding device according to claim 1, wherein the bonding device comprises a control unit which is electrically and/or wirelessly connected to the first gas pressure regulator and the first actuator and/or to the second gas pressure regulator and the second actuator, the control unit being configured to control the first gas pressure regulator to supply gas with a first gas pressure to the first pressure port and configured to control the movement of the first support element via the first actuator and/or the control unit being configured to control the second gas pressure regulator to supply gas with a second gas pressure to the second pressure port and configured to control the movement of the second support element via the second actuator.

4. The bonding device according to claim 1, wherein the first chuck and/or the second chuck has an opening extending from the respective holding surface, in particular extending fully through the respective chuck, wherein a portion of the opening adjacent to the respective holding surface being the respective pressure port, in particular wherein the respective support element being mounted in the opening and a supply channel is provided extending from the portion forming the pressure port to a back surface or peripheral surface of the respective chuck.

5. The bonding device according to claim 1, further comprising a first support structure and a second support structure,
   wherein the first chuck is mounted to the first support structure such that the first chuck is thermally isolated form the first support structure, and
   wherein the second chuck is mounted to the second support structure such that the second chuck is thermally isolated form the second support structure.

6. The bonding device according to claim 5, wherein the first chuck and/or the second chuck is mounted to the respective support structure by mounting elements, wherein the first chuck and/or the second chuck are spaced apart from the respective support structure.

7. The bonding device according to claim 5, wherein the bonding device comprises at least one chuck tempering device configured to equalize the temperatures of the first chuck and the second chuck, in particular wherein the first chuck and the second chuck each comprise at least one tempering channel, wherein the chuck tempering device comprises a tempering circuit including the at least one tempering channel of the first chuck and the at least one tempering channel of the second chuck in the same tempering circuit.

8. The bonding device according to claim 7, wherein the first chuck and/or the second chuck comprise a heating element, in particular a closed-loop heating element.

9. The bonding device according to claim 5, wherein the bonding device comprises a gas tempering device,
   wherein the first chuck comprises a first holding surface configured for holding a first substrate, the first holding surface having a first pressure port fluidically connected to the gas tempering device,
   wherein the second chuck comprises a second holding surface configured for holding a second substrate, the second holding surface having a second pressure port fluidically connected to the gas tempering device.

10. The bonding device according to claim 9, wherein the gas tempering device comprises a tempering material with at least one channel, the at least one channel being fluidically connected to the first pressure port and/or the second pressure port.

11. The bonding device according to claim 5, wherein the first chuck and/or the second chuck comprises a temperature sensor associated with the respective pressure port of the respective chuck.

12. A method for bonding a first substrate to a second substrate using a bonding device as claimed in claim 1, said bonding device comprising a first chuck with a first pressure port and a first support element and a second chuck, the method comprising the following steps:
   a) placing the first substrate on the first chuck covering the first pressure port and fixing the edge portion of the first substrate to the first chuck,
   b) placing the second substrate on the second chuck and fixing the second substrate to the second chuck,
   c) supplying gas with a first gas pressure to the first pressure port so that the first substrate is deflected towards the second substrate,
   d) moving the first support element to an extended position, in which the first support element protrudes above the first chuck towards the second chuck, and
   e) moving the first chuck and the second chuck relative to each other towards each other at least until the first substrate and the second substrate are in contact with one another.

13. The method according to claim 12, further comprising the following steps:
   a) supplying gas with a second gas pressure to a second pressure port of the second chuck so that the second substrate is deflected towards the first substrate, and
   b) moving a second support element to an extended position, in which the second support element protrudes above the second chuck towards the first chuck.

14. The method according to claim 12, wherein the first support element and/or the second support element is moved until it contacts the deflected first substrate or the deflected second substrate, respectively, wherein the amount of deflection of the respective substrate is measured based on the position of the support element, in particular wherein the respective gas pressure is adjusted based on the measured amount of deflection of the respective substrate.

15. The method according to claim 12, wherein in particular after the initial contact of the substrates, the first support element is actuated to apply an additional mechanical pressure to the first substrate, and/or
   that, in particular after the initial contact of the substrates, the second support element is actuated to apply an additional mechanical pressure to the second substrate.

16. The method according to claim 15, wherein the first support element and/or the second support element is retracted, in particular to a retracted position, after the mechanical pressure has been applied but before the substrates are in full contact with one another.

17. The method according to claim 12, wherein during movement of the chucks, the first gas pressure and the second gas pressure is controlled such that the incident angle ($\alpha$) between the first substrate and the second substrate after the initial contact is held between 0.1° and 1.5°, in particular between 0.4° and 0.8°, and/or such that the incident angle ($\alpha$) is split evenly by the final flat plane (P) between the substrates.

18. A method according to claim 12, further comprising the following steps:
   a) equalizing the temperatures of the first chuck and the second chuck,
   b) placing the first substrate on the first chuck and fixing the first substrate to the first chuck,
   c) placing the second substrate on the second chuck and fixing the second substrate to the second chuck, and
   d) moving the first chuck and the second chuck relative to each other towards each other at least until the first substrate and the second substrate are in contact with one another.

19. The method according to claim 18, wherein the first chuck and the second chuck are moved towards each other until the chucks directly contact each other, in particular wherein the chucks are held in contact at least until their temperatures are equalized.

20. The method according to claim 18, wherein the temperatures of the first chuck and of the second chuck are equalized using a chuck tempering device.

21. The method according to claim 20, wherein said temperature equalizing is carried out by circulating a tempering fluid through at least one tempering channel of the first chuck and at least one tempering channel of the second chuck using the same tempering circuit of the chuck tempering device.

22. The method according to claim 20, wherein said temperature equalizing is carried out by heating the first chuck and/or the second chuck using a heating element of the chuck tempering device, in particular a closed-loop heating element, in the respective chuck.

23. The method according to claim 18, wherein the first chuck comprises a first pressure port and/or the second chuck comprises a second pressure port, wherein gas with a first gas pressure is supplied to the first pressure port and/or gas with a second gas pressure is supplied to the second pressure port so that the substrates are deflected towards each other.

24. The method according to claim 23 wherein the gas is tempered prior to reaching the respective pressure port, in particular by contact with the respective chuck.

25. The method according to claim 18, wherein the gas is tempered by a gas tempering device, wherein the gas directed to the first pressure port and the second pressure port passes through a common gas tempering material of the gas tempering device, in particular the temperature of the common gas tempering material being controlled.

26. The method according to claim 23, wherein the bonding device comprises at least two gas temperature sensors, wherein each of the gas temperature sensors is associated with the first pressure port or the second pressure port, wherein the gas temperature sensors measure the temperature of the gas directed to the respective associated pressure port.

27. The method according to claim 18, wherein the bonding device comprises at least two chuck temperature sensors, wherein each of the chuck temperature sensors is associated with the first chuck or the second chuck, wherein the chuck temperature sensors measure the temperature of the respective chuck.

28. The method according to claim 26, wherein the first gas pressure and the second gas pressure are controlled based on the measured temperature of the gas directed to the first pressure port, of the gas directed to the second pressure port, of the measured temperature of the first chuck, of the measured temperature of the second chuck or a combination of any of the temperatures.

29. The method according to claim 18, wherein during movement of the chucks (24, 26), the first gas pressure and the second gas pressure is controlled such that the incident angle ($\alpha$) between the first substrate and the second substrate after the initial contact is held between 0.1° and 1.5°, in particular between 0.4° and 0.8°, and/or such that the incident angle ($\alpha$) is split evenly by the final flat plane (P) the substrates.

\* \* \* \* \*